United States Patent
Aloni (10) Patent No.: US 6,458,702 B1
(45) Date of Patent: Oct. 1, 2002

(54) METHODS FOR MAKING SEMICONDUCTOR CHIP HAVING BOTH SELF ALIGNED SILICIDE REGIONS AND NON-SELF ALIGNED SILICIDE REGIONS (75) Inventor: Efraim Aloni, Haifa (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 09/522,245

(22) Filed: Mar. 9, 2000

(51) Int. Cl.⁷ .......................................... H01L 21/4763
(52) U.S. Cl. .................... 438/682; 438/592; 438/595; 438/230; 438/303; 438/655; 438/664; 438/683
(58) Field of Search ................................ 438/682–683, 438/663–664, 655, 649, 651, 592, 595, 299–307, 230

(56) References Cited

U.S. PATENT DOCUMENTS

| 5,219,775 | A | | 6/1993 | Saeki et al. | |
|---|---|---|---|---|---|
| 5,610,420 | A | | 3/1997 | Kuroda et al. | |
| 5,768,192 | A | | 6/1998 | Eitan | |
| 5,869,396 | A | | 2/1999 | Pan et al. | |
| 5,966,603 | A | | 10/1999 | Eitan | |
| 6,037,625 | A | | 3/2000 | Matsubara et al. | |
| 6,103,611 | A | * | 8/2000 | En et al. | 438/595 |
| 6,146,994 | A | * | 11/2000 | Hwang | 438/633 |
| 6,162,675 | A | * | 12/2000 | Hwang et al. | 438/241 |
| 6,177,319 | B1 | * | 1/2001 | Chen | 438/275 |
| 6,194,258 | B1 | * | 2/2001 | Wuu | 438/200 |
| 6,207,492 | B1 | | 3/2001 | Tzeng et al. | |
| 6,207,543 | B1 | * | 3/2001 | Harvey et al. | 438/586 |
| 6,225,155 | B1 | * | 5/2001 | Lin et al. | 438/238 |
| 6,242,311 | B1 | | 6/2001 | Ahn | |
| 6,265,739 | B1 | | 7/2001 | Yaegashi et al. | |
| 6,271,087 | B1 | * | 8/2001 | Kinoshita et al. | 438/258 |

* cited by examiner

*Primary Examiner*—Tuan H. Nguyen
*Assistant Examiner*—Thanh Nguyen
(74) *Attorney, Agent, or Firm*—Edward S. Mao; Bever, Hoffman & Harms, LLP

(57) ABSTRACT

A semiconductor process is provided that creates fully-salicided transistors. in a first region and partially-salicided transistors in a second region. Each of the fully-salicided transistors includes a salicided gate electrode and salicided active regions. Each of the partially-salicided transistors includes a salicided gate electrode and active regions that are free from salicide. A silicide blocking layer prevents the formation of salicide in the active regions of the partially-salicided transistors. The silicide blocking layer is deposited over the first and second regions, and then removed over the first region. The remaining portion of the silicide blocking layer over the second region is then etched back until the upper surfaces of the gate electrodes in the second region are exposed. The remaining portions of the silicide blocking layer covers the active regions in the second region. A refractory metal is then deposited over the resulting structure and reacted. As a result, salicide is formed on the active regions and gate electrodes in the first region, but only on the gate electrodes in the second region.

10 Claims, 6 Drawing Sheets

METHODS FOR MAKING SEMICONDUCTOR CHIP HAVING BOTH SELF ALIGNED SILICIDE REGIONS AND NON-SELF ALIGNED SILICIDE REGIONS

CROSS-REFERENCE TO RELATED APPLICATIONS

This application relates to concurrently filed, co-pending application Ser. No. 09/532,246, "SEMICONDUCTOR CHIP HAVING BOTH POLYCIDE AND SALICIDE", by Edrei and Aloni, owned by the assignee of this application and incorporated herein by reference.

This application relates to U.S. patent application Ser. No. 09/261,706, filed Mar. 3, 1999, entitled "SEMICONDUCTOR CHIP HAVING FIELDLESS ARRAY WITH SALICIDE GATES AND METHOD FOR MAKING SAME" by Nachumovsky, et al., which is also incorporated herein by reference.

FIELD OF THE INVENTION

The present invention relates to the fabrication of semiconductor devices. More specifically, the present invention relates to a method of fabricating a semiconductor device that includes both self aligned silicide active regions and non-self aligned silicide active regions.

BACKGROUND OF THE INVENTION

In many semiconductor applications, different types of transistors are fabricated on a single semiconductor wafer. For example, in memory applications, memory transistors and logic transistors are fabricated on a single semiconductor wafer. Typically, different types of transistors are fabricated in different regions of the wafer. For example, in a memory chip, logic transistors are fabricated in a first region, while the memory transistors are fabricated in a second region of the wafer. However, in many applications different types of transistors are interspersed among each other on the wafer. For example, on some wafers, the memory transistors are fabricated as part of a fieldless array. A fieldless array is defined as an array that does not use field oxide to isolate the various elements of the array. Because field oxide is not required to isolate the memory transistors in a fieldless array, the memory transistors can be laid out with a relatively high density. However, conventional CMOS devices (e.g., transistors) are fabricated among the memory transistors, but do not form part of the fieldless array.

It may be difficult to achieve an acceptable yield when fabricating different types of transistors on the same wafer. For example, conventional salicide (self-aligned silicide) techniques for gate electrodes and actives regions in one type of transistor may cause shorts in a second type of transistor. Specifically, conventional salicide techniques may result in electrical short circuits between the source and drain regions of fieldless array transistors. These short circuits may exist for the following reason. During the formation of logic transistors, an etch is performed to create the sidewall spacers of the logic transistors. This etch can expose the silicon between the source and drain regions of the fieldless array transistors. To reduce the resistance of the gate structures of the transistors, a refractory metal is subsequently deposited over the upper surface of the wafer to form self-aligned silicide or "salicide" gate electrodes. A silicide layer is formed by reacting this refractory metal with exposed silicon. Thus, a silicide layer forms between the source and drain regions of the fieldless array transistors, thereby causing a short circuit. It would therefore be desirable to have a method for fabricating transistors having salicide gate and active regions as well as transistors with salicide gate but without salicide active regions on the same wafer. For clarity, the term "fully-salicided transistor" refers to a transistor having low resistance salicide on the gate and active regions of the transistor. Conversely, the term "partially-salicided transistor" refers to a transistor having low resistance salicide only on the gate of the transistor.

SUMMARY

Accordingly, the present invention provides efficient processes for fabricating fully-salicided transistors and partially salicided transistors on the same wafer. A fully-salicided transistor includes silicide on the gate and active regions of the transistor. A partially-salicided transistor has silicide on the gate of the transistor but not on the active regions.

Specifically, in accordance with one embodiment of, the present invention, fully-salicided transistors are formed in a first region of the semiconductor device, while partially-salicided transistors are formed in a second region of the semiconductor device. Conductive gates are formed in both the first region and the second region of the semiconductor device. Then, active regions for the transistors are formed in the first region and second region of the semiconductor device. Different techniques and processing steps may be used to form the active regions in the first region of the semiconductor device and the active regions in the second region of the semiconductor device.

A first thin dielectric layer is deposited over the surface of the semiconductor device. Then, a second thin dielectric layer is deposited over the semiconductor device. The second dielectric layer is an etch stop layer, such as a nitride layer. A thick silicide blocking layer is deposited over the second thin dielectric layer. A portion of the thick silicide blocking layer in the first region of the semiconductor device is etched to expose the second thin dielectric layer in the first region of the semiconductor device. An oxide spacer layer is deposited over the semiconductor device and etched back to form oxide spacers and remove the thin dielectric layers in the first region of the semiconductor device. Then, salicide layers are formed over the active regions in the first region of the semiconductor device and the conductive gates.

The above-described process steps advantageously enable fully-salicided transistors and partially-salicided transistors on the same semiconductor device. The present invention will be more fully understood in view of the following description and drawings.

DETAILED DESCRIPTION

Figure 1:
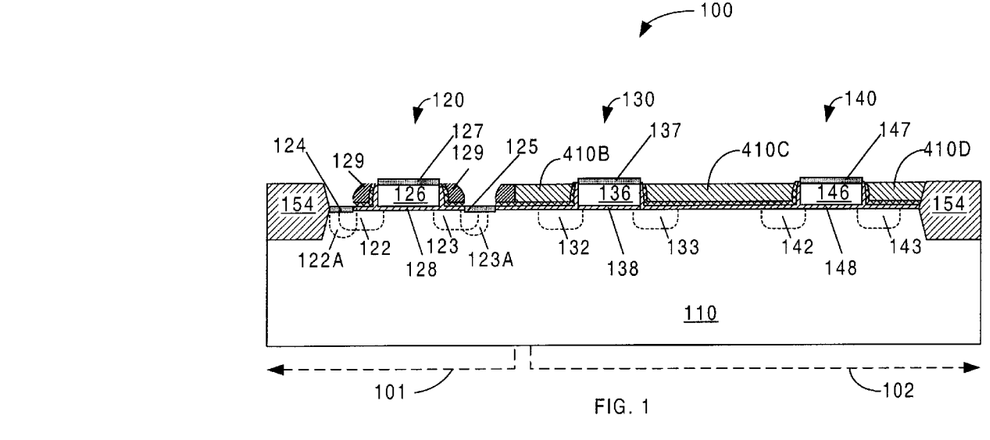
FIG. 1 is a cross sectional view of a semiconductor device that includes a fully-salicided transistor and two partially-salicided transistors in accordance with one embodiment of the present invention.

FIG. 1 is a cross sectional view of a semiconductor device 100 that is fabricated in accordance with one embodiment of the present invention. Semiconductor device 100 is divided into a first region 101 and a second region 102. Specifically, semiconductor device 100 includes a transistor having a salicided gate and salicided active regions fabricated in first region 101, while transistors having only salicided gates are fabricated in second region 102. As stated above, the term "fully-salicided transistor" refers to a transistor having low resistance salicide on the gate and active regions of the transistor. Conversely, the term "partially-salicided transistor" refers to a transistor having low resistance salicide only on the gate of the transistor. In some embodiments, fully-salicided transistors may also be fabricated in second region 102. Similarly, in some embodiments, partially-salicided transistors may also be fabricated in first region 101. The various elements of semiconductor device 100 are not shown to scale.

Semiconductor device 100 includes a fully-salicided transistor 120 fabricated in first region 101 of semiconductor device 100. It is understood that first region 101 will typically include many other transistors. Fully-salicided transistor 120 includes lightly doped active regions 122 and 123, heavily doped active regions 122A and 123A, gate oxide layer 128, conductively doped polycrystalline silicon (polysilicon) gate 126, electrically insulating sidewall spacers 129, and metal salicide layers 127, 124 and 125. Together, polysilicon gate 126 and metal salicide layer 127 form a salicide control gate for fully-salicided transistor 120. Metal salicide layers 124 and 125 provide low resistive contacts to heavily doped active regions 122A and 123A, respectively.

Semiconductor device 100 also includes partially-salicided transistors 130 and 140 in second region 102. Partially-salicided transistor 130 includes active regions 132 and 133, gate oxide layer 138, conductively doped polysilicon gate 136, and metal salicide layer 137. Together, polysilicon gate 136 and metal salicide layer 137 form a salicide control gate for partially-salicided transistor 130. Similarly, partially-salicided transistor 140 includes active regions 142 and 143, gate oxide layer 148, conductively doped polysilicon gate 146, and metal salicide layer 147. Together, polysilicon gate 146 and metal salicide layer 147 form a salicide control gate for partially-salicided transistor 140. Semiconductor device 100 also includes silicide blocking portions 410B, 410C, and 410D the formation of which is described in detail below. Gate oxide layers 128, 138 and 148 may differ in thickness depending on the exact processes used to fabricate the transistors.

FIGS. 2–10 illustrates the fabrication of semiconductor device 100 in accordance with one embodiment of the present invention. As explained above, some embodiments of the present invention may intersperse fully-salicided transistors with partially salicided transistors. However, for clarity, the embodiment of FIGS. 2–10 shows the fabrication steps of fully-salicided transistor 120 in first region 101 and the fabrication of partially-salicided transistors 130 and 140 in second region 102.

Figure 2:
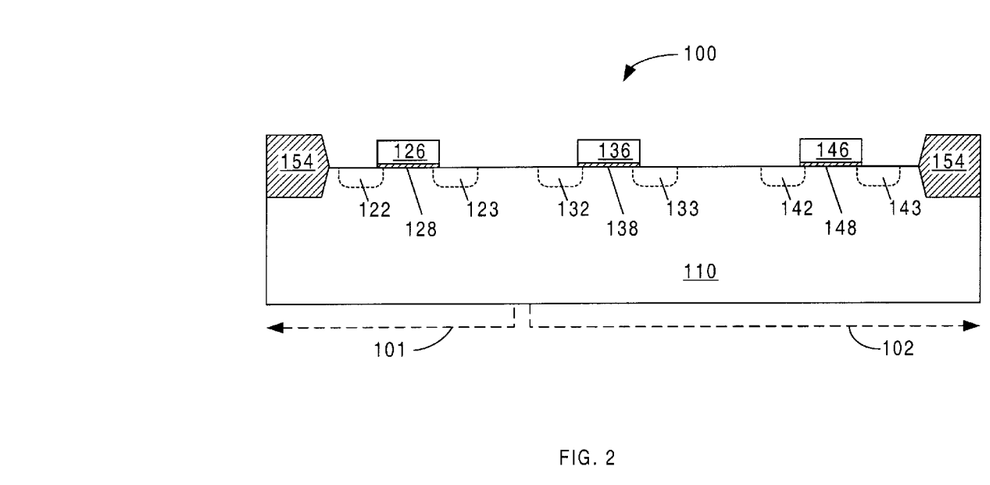
FIG. 2 is a cross sectional view of a semiconductor device with conductive gates being fabricated in accordance with one embodiment of the present invention.

As shown in FIG. 2, polysilicon gates 126, 136, and 146 are formed over gate oxide 128, 138, and 148 respectively, using conventional processing techniques. In some embodiments, polysilicon gates 126, 136, and 146 are fabricated with a low temperature deposition process which results in amorphous silicon. For conciseness, polysilicon, as used herein, encompasses amorphous silicon. In addition, active regions 122, 123, 132, 133, 142, and 143 are formed using conventional ion implantation and diffusion techniques. In some embodiments, active regions 122 and 123 in first region 101 are formed with different processing, steps as compared to active regions 132, 133, 142, and 143 in second region 102. Also shown in FIG. 2 are field oxide regions 154. The field oxide is thermally grown in accordance,with conventional CMOS processing techniques (e.g., locos). to a thickness in the range of about 3000 to 8000 Å, or more particularly, in the range of about 4000 to 6500 Å. In the described embodiment, the field oxide is grown to a thickness of about 5000 Å.

Figure 3:
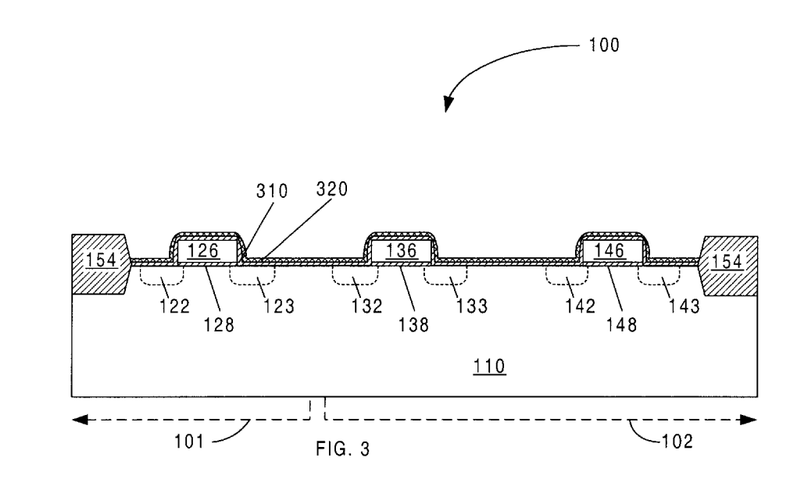
FIG. 3 is a cross sectional view of a semiconductor device with thin dielectric layers being fabricated in accordance with one embodiment of the present invention.

As shown in FIG. 3, after formation of active regions 122, 123, 132, 133, 142, and 143, a thin dielectric layer 310 is deposited over the surface of semiconductor device 100 to a thickness in the range of 100 to 500 Å. In the described embodiment, dielectric layer 310 is an oxide layer deposited to a thickness of about 200 Å. Then, an optional second thin dielectric layer 320 is deposited over dielectric layer 310. The thickness of dielectric layer 320 is in the range of 100 to 500 Å. In the described embodiment, dielectric layer 320 is a silicon nitride layer deposited to a thickness of about 200 Å. Other embodiments may use oxynitride or other low etch rate dielectrics. Thin dielectric layers 310 and/or 320 are used for etch stopping as described below.

Figure 4:
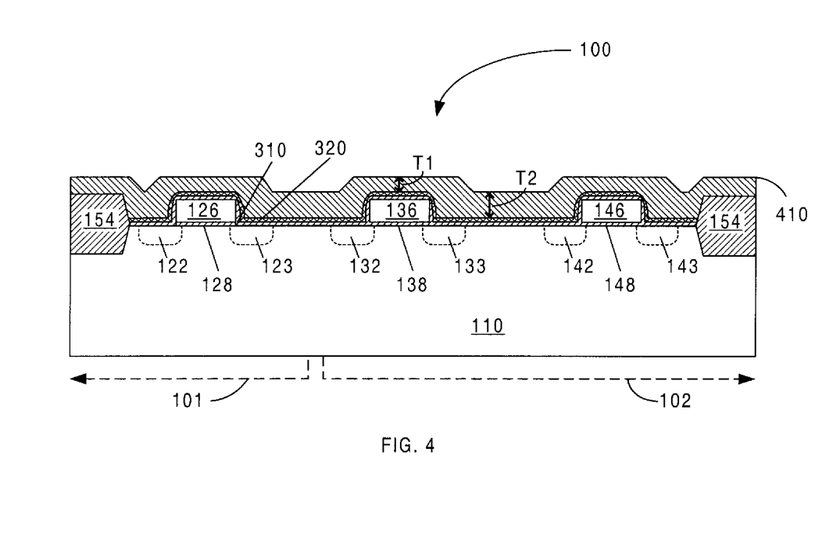
FIG. 4 is a cross sectional view of a semiconductor device with a silicide blocking layer being fabricated in accordance with one embodiment of the present invention.
Figure 5:
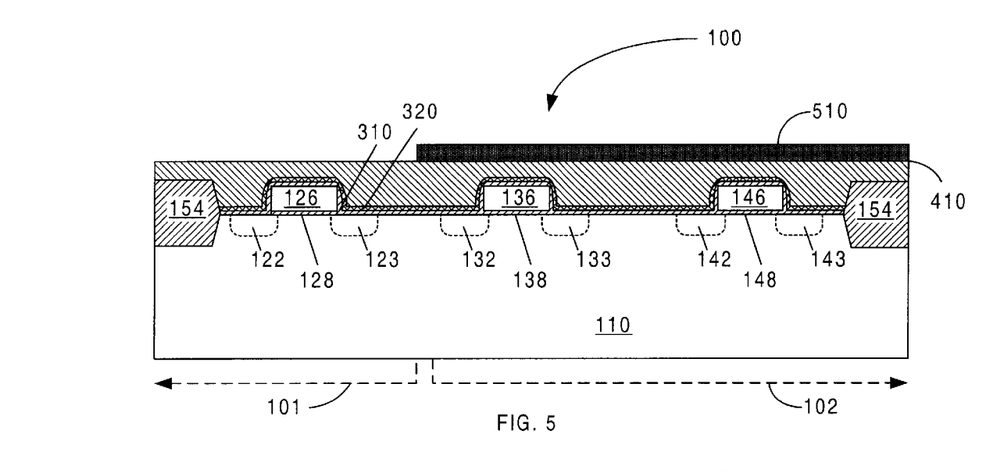
FIG. 5 is a cross sectional view of a semiconductor device with a photoresist mask being fabricated in accordance with one embodiment of the present invention.

As shown in FIG. 4, a silicide blocking layer 410 is formed over dielectric layer 320. Silicide blocking layer 410 can be formed using processes such as SOG, APL/FF, BPSG, or others. Silicide blocking layer 410 can also be formed using oxide deposition and CMP planarization, resist etch back techniques, or any other planarization method. As is well known in the art, SOG and APL/FF are self planarized gap filling layers and require no added process steps to planarize silicide block layer 410. However, BPSG, CMP or resist etch back, may need additional process steps to planarize silicide blocking layer 410. The thickness of silicide blocking layer 410 is determined by the thickness of polysilicon gates 126, 136, and 146, and the planarization technique used. Specifically, a thickness T1 of the portions of silicide blocking layer 410 overlying polysilicon gates 126, 136, and 146 should be less than a thickness T2 of the portions of silicide blocking layer 410 overlying active regions 122, 123, 132, 133, 142, and 143. In the described embodiment, thickness T1 of the portions of silicide blocking layer 410 overlying polysilicon gates 126, 136, and 146 is approximately one-tenth of thickness T2 of the portions of silicide blocking layer 410 overlying active regions 122, 123, 132, 133, 142, and 143.

Figure 6:
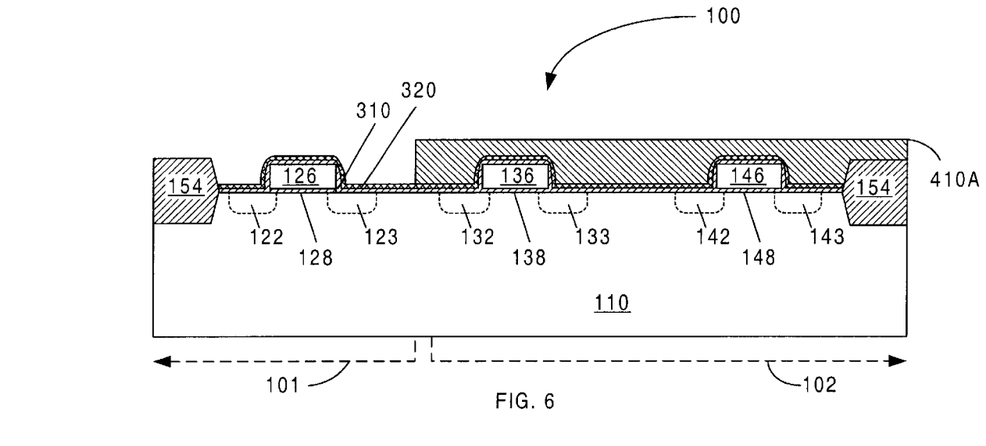
FIG. 6 is a cross sectional view of a semiconductor device in which a portion of a silicide blocking layer is removed in accordance with one embodiment of the present invention.

A layer of photoresist is then spun over the upper surface of semiconductor device 100. This photoresist layer is exposed and developed to create a photoresist mask 510 (FIG. 5), which covers second region 102. Silicide blocking layer 410 is then etched using a high selectivity etchant such as an HF mixture (e.g. a BOE: buffered oxide etchant). As shown in FIG. 6, the high selectivity etchant etches through the exposed portions of silicide blocking layer 410 but only minimally etches dielectric layer 320. Photoresist mask 510 is then stripped using standard techniques.

Figure 7:
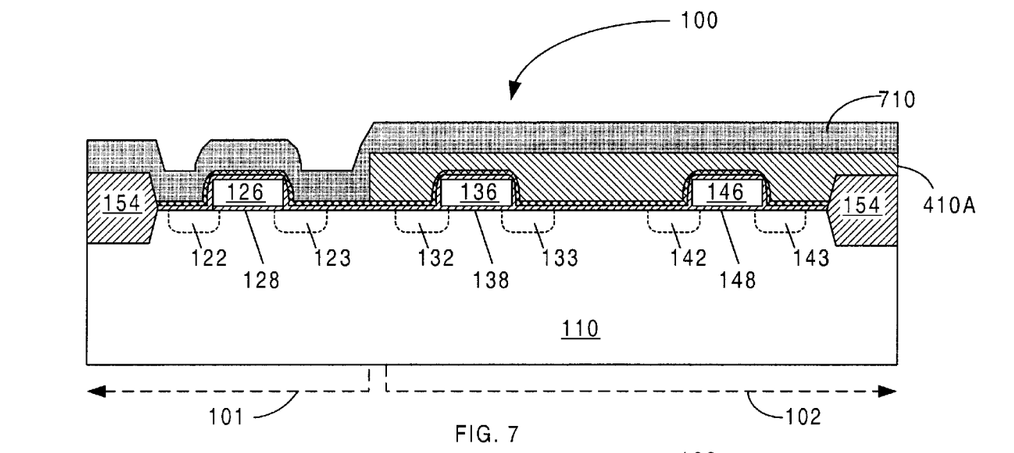
FIG. 7 is a cross sectional view of a semiconductor device with an oxide spacer layer being fabricated in accordance with one embodiment of the present invention.
Figure 8:
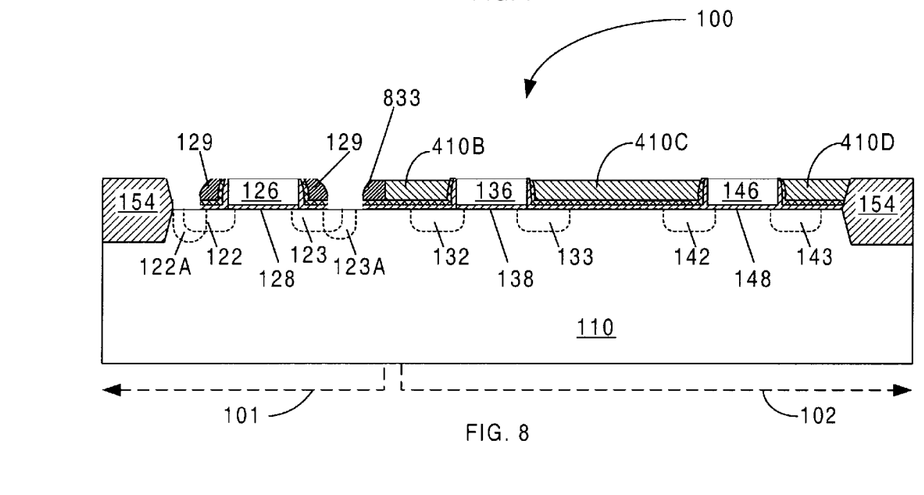
FIG. 8 is a cross sectional view of a semiconductor device with oxide spacers being fabricated in accordance with one embodiment of the present invention.

Then, as shown in FIG. 7, an oxide spacer layer 710 is deposited to a thickness in the range of 1000 to 3500 Å. In the described embodiment, oxide spacer layer 710 is deposited to a thickness of about 1800 Å. Using standard oxide spacer fabrication techniques, oxide layer 710 is etched to form oxide spacers 129, as well as residual oxide portion 833. The etching process for oxide layer 710 is modified to also remove the portions of silicide blocking layer 410, dielectric layer 310, and dielectric layer 320 overlying active regions 122 and 123, and polysilicon gates 126, 136, and 146. After the etching process, silicide blocking layer 410 is reduced to silicide blocking portions 410B, 410C, and 410D. Similarly, the portions of dielectric layer 310 and 320 under silicide blocking portions 410B, 410C, and 410D remain on semiconductor device 100. However, the upper surfaces of active regions 122 and 123 and the upper surfaces of polysilicon gates 126, 136, and 146 are exposed. A conventional heavy doping step is performed to form heavily doped active regions 122A and 123A.

Figure 9:
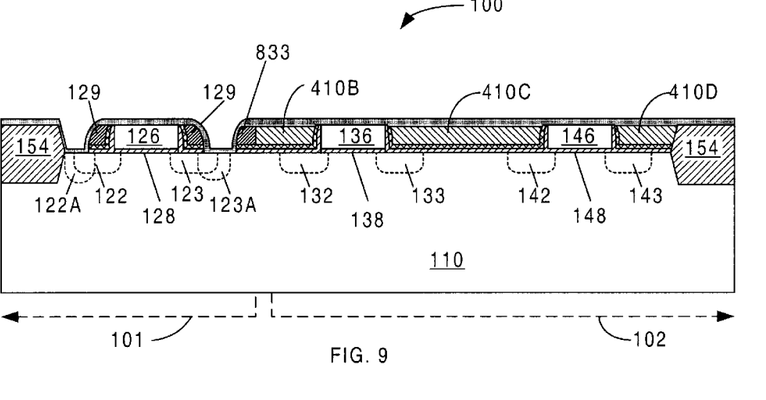
FIG. 9 is a cross sectional view of a semiconductor device with a metal layer being fabricated in accordance with one embodiment of the present invention.

As shown in FIG. 9, a blanket layer of a metal, such as nickel, tungsten, titanium, or cobalt, is deposited or sputtered over the upper surface of semiconductor device 100 to create metal layer 910. A first anneal is then performed to form metal salicide at those locations where metal layer 910 overlies silicon. The portions of metal layer 910 which overlie field oxide 154, oxide spacers 129, residual oxide 833, and silicide blocking portions 410B, 410C, and 410D do not react with these regions and therefore, remain metal.

Figure 10:
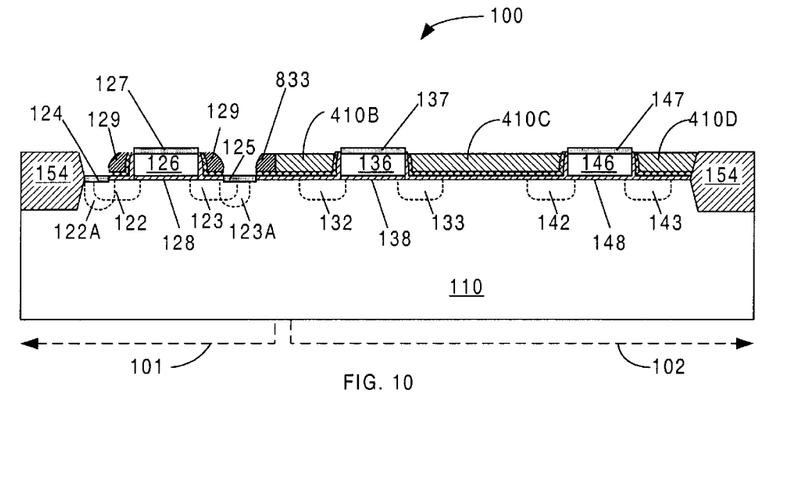
FIG. 10 is a cross sectional view of a semiconductor device with silicide layers being fabricated in accordance with one embodiment of the present invention.

In FIG. 10, a metal etching step removes the unreacted portions of metal layer 910 leaving salicide layers 124, 125, 127, 137, and 147. A second anneal is sometimes performed to reduce the silicide sheet resistance. At this time, fully-salicided transistor 120 and partially-salicided transistors 130 and 140 are complete. Typically, additional processing using conventional techniques are used to fabricate contacts to the gates and active regions of the transistors.

Figure 11:
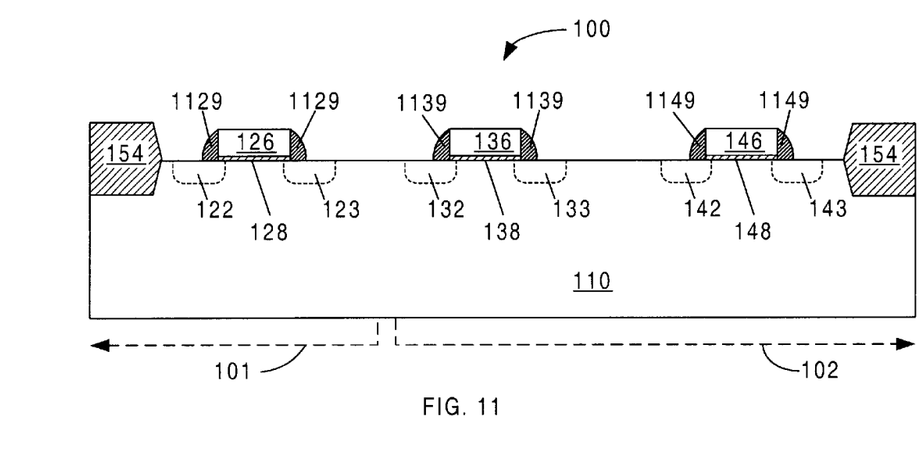
FIG. 11. is a cross sectional view of a semiconductor device with conductive gates being fabricated in accordance with one embodiment of the present invention.
Figure 12:
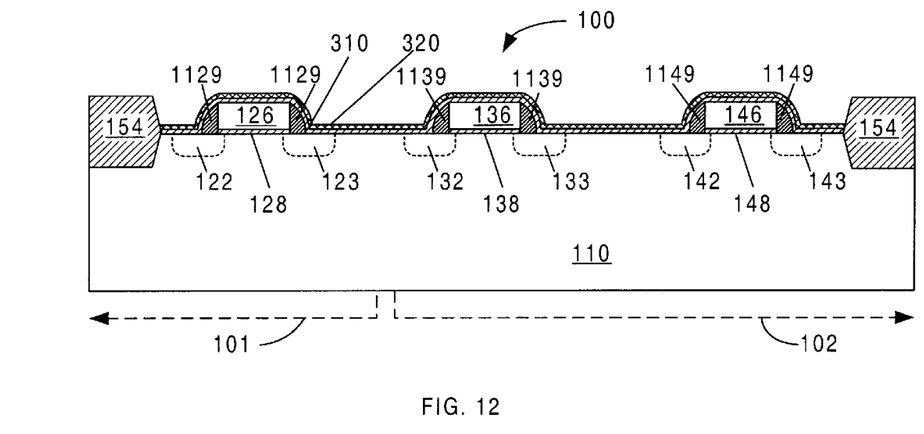
FIG. 12 is a cross sectional view of a semiconductor device with thin dielectric layers being fabricated in accordance with one embodiment of the present invention.

In some embodiments of the present invention, oxide spacers are also formed on partially salicided transistors as well as the fully salicided transistors. In these embodiments, oxide spacers are formed prior to formation of the thin dielectric layers. For example, as shown in FIG. 11, oxide spacers 1129, 1139, and 1149 are formed on polysilicon gates 126, 136, and 146, respectively. Then, conventional source and drain formation techniques are used to form active regions 122 and 123 adjacent polysilicon gate 126, active regions 132 and 133 adjacent polysilicon gate 136, and active regions 142 and 143 adjacent polysilicon gate 146. Then, as illustrated in FIG. 12, thin dielectric layers 310 and 320 are deposited over semiconductor substrate 110. Processing then continues as described above with respect to FIGS. 4, 5, 6, 8, 9, and 10.

In the above-described manner, fully-salicided transistors and partially-salicided transistors can be fabricated on a single wafer using an efficient semiconductor process. The various embodiments of the structures and methods of this invention that are described above are illustrative only of the principles of this invention and are not intended to limit the scope of the invention to the particular embodiments described. For example, in view of this disclosure, those skilled in the-art can define other transistor types, gate structures, silicides, metals, dielectrics, silicide blocking layers, and so forth, and use these alternative features to create a method, semiconductor device, or integrated circuit according to the principles of this invention. Thus, the invention is limited only by the following claims.

What is claimed is:

1. A method for forming a semiconductor device having a first region and a second region, the method comprising the steps of:

forming a plurality of conductive gates in the first region and the second region;

forming a first plurality of active regions in the first region;

forming a second plurality of active regions in the second region;

forming silicide blocking portions over the second plurality of active regions by
      depositing a silicide blocking layer over the first dielectric layer, wherein the silicide blocking layer extends over the first region and the second region;
      etching a portion of the silicide blocking layer in the first region;

depositing a spacer oxide layer over the semiconductor device;

etching the spacer oxide layer and the silicide blocking layer to expose the plurality of conductive gates, and the plurality of active regions in the first region; and forming a plurality of salicide layers overlying the plurality of polysilicon gates and the first plurality of active regions.

2. The method of claim 1, further comprising the steps of depositing a first dielectric layer over an upper surface of the semiconductor device, wherein the first dielectric layer overlies the plurality of conductive gates and wherein the first dielectric layer extends over the first region and the second region.

3. The method of claim 2, further comprising the step of depositing a second dielectric layer over the first dielectric layer.

4. The method of claim 3, wherein the first dielectric layer is an oxide layer and the second dielectric layer is a nitride layer.

5. The method of claim 1, wherein the step of forming a plurality of silicide layers overlying the plurality of polysilicon gates and the first plurality of active regions, further comprises the steps of:

depositing a metal layer over the semiconductor device;

annealing the metal layer to form the plurality of silicide layers.

6. The method of claim 5, wherein metal layer is a titanium layer.

7. The method of claim 1, wherein the silicide blocking layer has a first thickness over the conductive gates and a second thickness over the active regions.

8. The method of claim 7, wherein the first thickness is less than the second thickness.

9. The method of claim 8, wherein the first thickness is approximately 1/10 of the second thickness.

10. The method of claim 1, wherein the silicide blocking layer is substantially planar.

* * * * *

UNITED STATES PATENT AND TRADEMARK OFFICE
CERTIFICATE OF CORRECTION

| | |
|---|---|
| PATENT NO. | : 6,458,702 B1 |
| APPLICATION NO. | : 09/522245 |
| DATED | : October 1, 2002 |
| INVENTOR(S) | : Efraim Aloni |

Page 1 of 1

It is certified that error appears in the above-identified patent and that said Letters Patent is hereby corrected as shown below:

In the Specification

Column 6, line 16, should read "depositing a silicide blocking layer over a first dielec-"

Column 6, line 26, should read "the first plurality of active regions in the first region; and"

Column 6, line 31, should read "depositing the first dielectric layer over an upper surface of the"

Column 6, line 42, should read "plurality of salicide layers overlying the plurality of poly-"

Column 6, line 46, should read "annealing the metal layer to form the plurality of salicide"

Signed and Sealed this
Twenty-eighth Day of July, 2015

Michelle K. Lee
*Director of the United States Patent and Trademark Office*